United States Patent [19]

Sandhu et al.

[11] Patent Number: 5,187,638
[45] Date of Patent: Feb. 16, 1993

[54] BARRIER LAYERS FOR FERROELECTRIC AND PZT DIELECTRIC ON SILICON

[75] Inventors: Gurtej S. Sandhu; Pierre Fazan, both of Boise, Id.

[73] Assignee: Micron Technology, Inc., Boise, Id.

[21] Appl. No.: 919,671

[22] Filed: Jul. 27, 1992

[51] Int. Cl.$^5$ .................. H01L 29/78; H01G 4/06
[52] U.S. Cl. ........................... 361/313; 257/295; 257/306; 257/310
[58] Field of Search ............... 29/25.42; 361/311, 312, 361/313, 321; 357/51; 365/149

[56] References Cited

U.S. PATENT DOCUMENTS

| | | |
|---|---|---|
| 5,053,917 | 10/1991 | Miyasaka et al. .................. 361/321 |
| 5,099,305 | 3/1992 | Takenaka ............................. 357/51 |
| 5,134,451 | 7/1992 | Katoh . | |

OTHER PUBLICATIONS

"A Stacked Capacitor With (Ba$_x$Sr$_{1-x}$) TiO$_3$ For 256M Drams" by Koyama et al., IEDM 91', pp. 32.1.1–32.1.4.
"Structural And Electrical Evolution Of The Al/RuO$_2$ Interface Upon Thermal Annealing" by Vu et al., Solid State Electronics, vol. 34, No. 3, pp. 271-278.

Primary Examiner—Donald Griffin
Attorney, Agent, or Firm—David J. Paul

[57] ABSTRACT

The present invention introduces an effective way to produce a thin film capacitor utilizing a high dielectric constant material for the cell dielectric through the use of a single transition metal, such as Molybdenum, for a bottom plate electrode which oxidizes to form a highly conducting oxide. Using Molybdenum, for example, will make a low resistive contact to the underlying silicon since Molybdenum reacts with silicon to form MoSix with low (<500 μΩ-cm) bulk resistance. In addition, Mo/MoSix is compatible with present ULSI process flow or fabricating DRAMs and the like.

34 Claims, 1 Drawing Sheet

BARRIER LAYERS FOR FERROELECTRIC AND PZT DIELECTRIC ON SILICON

FIELD OF THE INVENTION

This invention relates generally to thin film fabrication processes for semiconductors and in particular to fabrication of capacitors in semiconductor fabrication processes.

BACKGROUND OF THE INVENTION

Thin film fabrication of capacitors has become an important technology, particularly in dynamic random access memories (DRAMs), as die size of many semiconductor devices continue to shrink.

In DRAMs, the storage capacitor has taken on many innovative designs and encompasses many materials, all for the sake of reducing the die space required for a given capacitor while maintaining or even increasing the storage capability of a capacitor.

As DRAM density has increased (1 MEG and beyond) thin film capacitors, such as stacked capacitors, trenched capacitors, or combinations thereof, have evolved in attempts to meet minimum space requirements. Many of these designs have become elaborate and difficult to fabricate consistently as well as efficiently.

The recent generations of DRAMs (4 MEG, 16 MEG for example) have pushed thin film capacitors technology to the limit of processing capability thus, greater attention has been given to the development of thin film dielectric materials that possess a dielectric constant having at least a 10X increase over the conventional dielectrics used today (oxides and nitrides).

Recently, a lot of attention has been paid to Barium Strontium Titanate Strontium Titanate (ST), Barium Titanate (BT), Lead Zirconate Titanate (PZT) and other high dielectric constant materials as a cell dielectric material of choice for DRAMs. These materials and in particular BST, have a high dielectric constant (>300) and low leakage currents which makes them very attractive for high density memory chips. These materials, however, suffer from many drawbacks. One major hurdle to incorporating these material into present day design is the fact that they react with polysilicon.

Capacitors made by polysilicon-PZT/BST sandwiches undergo physical degradation with thermal cycles. During chemical vapor deposition (CVD) of PZT/BST, oxygen in the ambient tends to oxidize the electrode material. This however, is undesirable since oxide has a much lower dielectric constant compared to PZT/BST and adds to the capacitance in series thus drastically lowering the total capacitance of the capacitor. Therefore, even a thin native layer of oxide grown on the electrode results in a large degradation in capacitance.

Solutions to the problem which include triple layer cell plates consisting of poly Si/Ta/Pt as disclosed in "A STACKED CAPACITOR WITH (BaxSr1-x)TiO3 for 256M DRAM", K. Koyama et al., IEDM 91, pp 823-826, and U.S. Pat. No. 5,053,917, Miyasaka et al., are complex and cumbersome to put into a manufacturing process flow (also see FIG. 1 of this disclosure).

The simpler cell plate scheme of the present invention will address all the issues mentioned above and thereby provide a manufacturable capacitor for future DRAM generations.

All U.S. Patents and publications cited herein are hereby incorporated by reference.

SUMMARY OF THE INVENTION

The present invention introduces an effective way to produce a thin film capacitor utilizing a high dielectric constant material for the cell dielectric through the use of a single layer of metal, such as a metal selected from (but not limited to) transition metal, for a bottom plate electrode which oxidizes to form highly conducting oxides. At the same time, this metal will make a low resistive contact to the underlying silicon. Another important requirement is that the metal material chosen must be able to breakdown native oxide that forms on the conductive material exposed for a buried contact.

Molybdenum (Mo) is one such material and is an ideal choice in light of the present invention since MoO is highly conducting and it reacts with silicon to form MoSix with low (<500 $\mu\Omega$-cm) bulk resistance. In addition, Mo/MoSix is compatible with present ULSI process flow for fabricating DRAMs and the like.

DETAILED DESCRIPTION OF THE PREFERRED EMBODIMENTS

Figure 1:
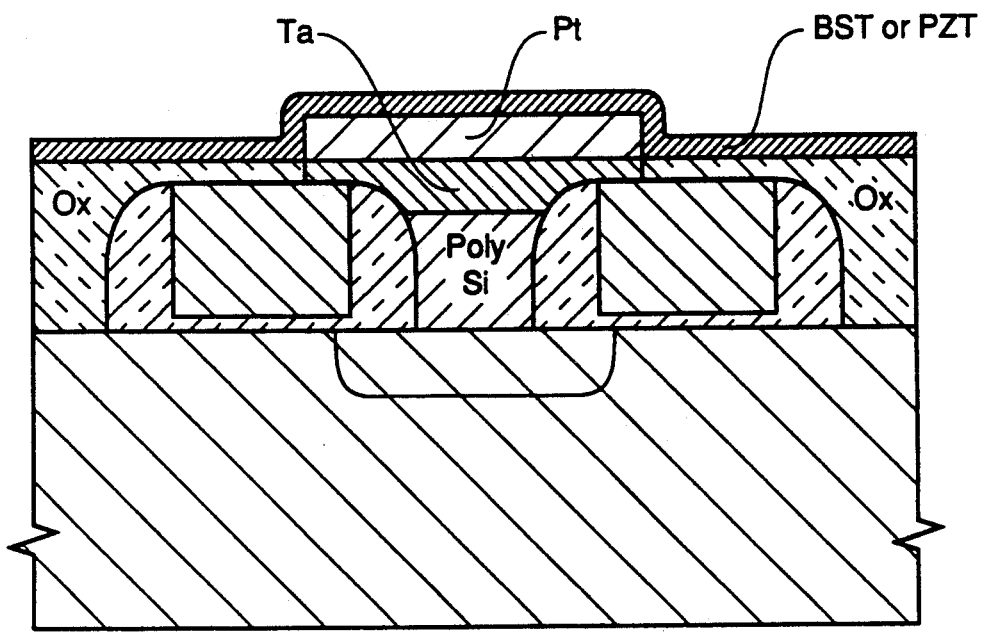
FIG. 1 depicts a composite cross-sectional view of a lower electrode of a thin film capacitor using three layers of material processed from a standard process.
Figure 2:
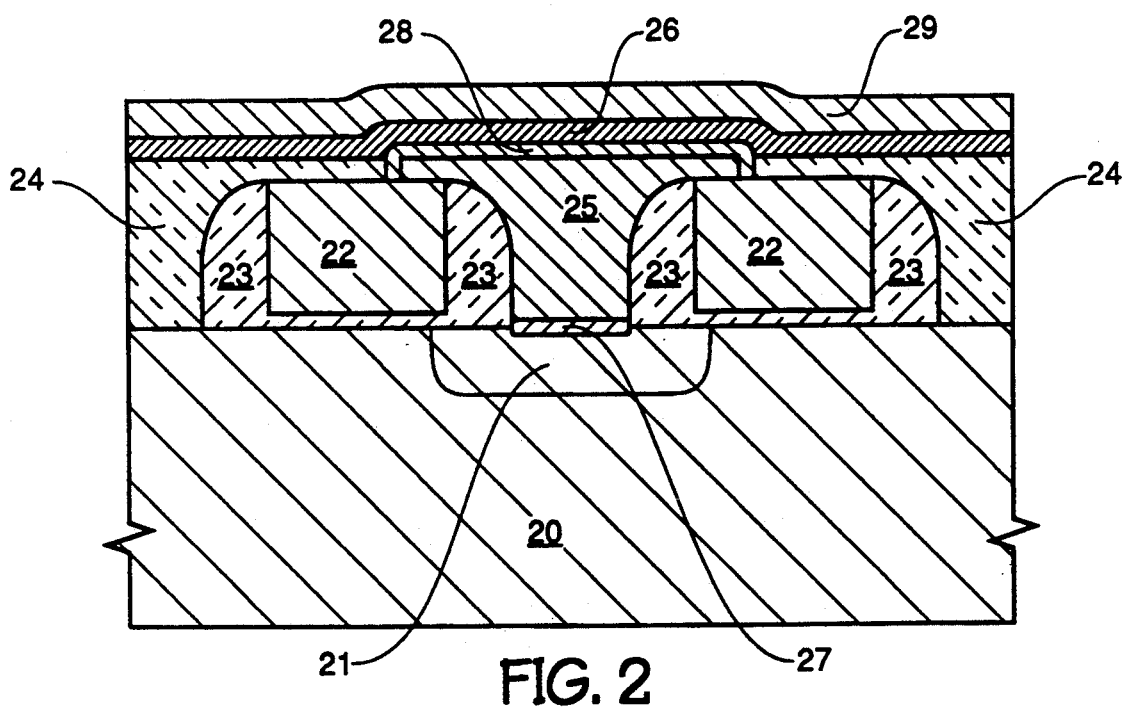
FIGS. 2 depicts a composite cross-sectional view of a lower electrode of a thin film capacitor using a single layer of Molybdenum in light of the present invention.

The process steps of the present invention, as depicted in FIG. 2, are described hereinafter.

Referring now to FIG. 2, silicon wafer 20 has been processed with conventional process steps to form word lines 22, diffusion area 21 and insulative spacers 23. A buried contact has also been formed in insulator 24 to provide access to diffusion area 21.

In light of the present invention it is preferred to use Molybdenum (Mo). Therefore, using Mo as an example, a layer of Mo is deposited (preferably by chemical vapor deposition) and planarized to form a lower (or bottom) electrode 25 to a storage capacitor. Due to the unavoidable presence of oxygen, at ambient the Mo in electrode 25 will oxidize to form a highly conductive MoO 28. Next a layer of BST or PZT or a similar high dielectric constant material (or a combination thereof), is formed over the existing wafer surface, thereby coating electrode 25 (and MoO 28), word lines 22 and insulators 23 and 24. At this point it is optional (and preferred) to sinter (anneal) the existing structure to improve the PZT/BST leakage as well as the Mo-Si contact thereby forming an MoSix interface between electrode 25 and diffused area 21 of silicon 20. This MoSix interface provides a contact having less than 100 $\mu\Omega$-cm bulk resistance.

The second capacitor electrode 29 may now be formed from conventional materials (such as conductively doped polysilicon Tungsten or Titanium Nitride) and the wafer completed by conventional process steps.

Forming metal silicides to obtain a desired resistivity depends namely on annealing temperature and annealing time which is know in the art. For example, in the text "SILICON PROCESSING FOR THE VLSI ERA - VOLUME I", 1986, S. Wolf and R. N. Tauber, hereby incorporated by reference, (in particular Chapter 11, pp. 385–406) formation of metal silicides, annealing times and temperatures is discussed. Therefore, forming metal silicides has only been discussed herein in general terms.

It is to be understood that although the present invention has been described in a preferred embodiment, various modifications known to those skilled in the art, such as substituting other metals such as transition metals including Tungsten, Titanium, Cobalt, Ruthenium, Zirconium, Hafnium, Niobium, Chromium, Nickel, Vanadium, Tantalum, Palladium, Platinum, etc. for Molybdenum that will break down native oxides, form highly conductive oxides and form highly conductive silicides, may be made without departing from the invention as recited in the several claims appended hereto.

We claim:

1. A capacitor for a semiconductor device constructed on a silicon substrate comprising:
   a) a first conductive electrode comprising a single metal;
   b) a cell dielectric material superjacent said first conductive electrode; and
   c) a second conductive electrode superjacent said cell dielectric material;
   wherein a conductive oxide layer exists between said metal electrode and said cell dielectric and a metal silicide contact between said metal electrode and said silicon substrate.

2. The capacitor of claim 1 wherein said metal is a transition metal.

3. The capacitor of claim 2 wherein said transition metal is a metal selected from the group consisting essentially of Molybdenum, Tungsten, Titanium, Cobalt, Ruthenium, Zirconium, Hafnium, Niobium and Chromium, Nickel, Vanadium, Tantalum, Palladium and Platinum.

4. The capacitor of claim 1 wherein said metal silicide resistivity is less than 500 $\mu\Omega$-cm.

5. The capacitor of claim 1 wherein said cell dielectric comprises Lead Zirconate Titanate (PZT).

6. The capacitor of claim 1 wherein said cell dielectric comprises doped Lead Zirconate Titanate (PZT).

7. The capacitor of claim 1 wherein said cell dielectric is a material selected from the group consisting essentially of Barium Strontium Titanate (BST), Strontium Titanate (ST), Barium Titanate (BT) and Lead Zirconate Titanate (PZT).

8. The capacitor of claim 1 wherein said cell dielectric comprises a combination of Barium Strontium Titanate (BST) and Lead Zirconate Titanate (PZT).

9. The capacitor of claim 1 wherein said second conductive electrode comprises conductively doped polysilicon.

10. A capacitor for a semiconductor device constructed on a silicon substrate comprising:
    a) a molybdenum electrode;
    b) a cell dielectric material superjacent said molybdenum electrode; and
    c) a top conductive electrode superjacent said cell dielectric material;
    wherein a conductive molybdenum oxide layer exists between said molybdenum electrode and said cell dielectric and a molybdenum silicide contact exists between said molybdenum electrode and said silicon substrate.

11. The capacitor of claim 10 wherein said resistive molybdenum silicide resistivity is less than 500 $\mu\Omega$-cm.

12. The capacitor of claim 10 wherein said cell dielectric comprises Lead Zirconate Titanate (PZT).

13. The capacitor of claim 10 wherein said cell dielectric comprises doped Lead Zirconate. Titanate (PZT).

14. The capacitor of claim 10 wherein said cell dielectric is a material selected form the group consisting essentially of Barium Strontium Titanate (BST), Strontium Titanate (ST), Barium Titanate (BT) and Lead Zirconate Titanate (PZT).

15. The capacitor of claim 10 wherein said cell dielectric comprises a combination of Barium Strontium Titanate (BST) and Lead Zirconate Titanate (PZT).

16. The capacitor of claim 10 wherein said second conductive electrode comprises conductively doped polysilicon.

17. A process for fabricating a capacitor for a semiconductor device constructed on a silicon substrate comprising the steps of:
    a) forming a first conductive electrode comprising a single metal;
    b) forming a cell dielectric material superjacent said first conductive electrode; and
    c) forming a second conductive electrode superjacent said cell dielectric material;
    wherein said metal oxidizes to form a conductive metal oxide layer between said metal electrode and said cell dielectric and said metal reacts with said silicon substrate to form a metal silicide contact between said metal electrode and said silicon substrate.

18. The process of claim 17 wherein said metal is a transition metal.

19. The process of claim 18 wherein said transition metal is a metal selected from the group consisting essentially of Molybdenum, Tungsten, Titanium, Cobalt, Ruthenium, Zirconium, Hafnium, Niobium and Chromium, Nickel, Vanadium, Tantalum, Palladium and Platinum.

20. The process of claim 17 wherein said metal silicide resistivity is less than 500 $\mu\Omega$-cm.

21. The process of claim 17 wherein said forming a transition metal electrode comprises depositing said transition metal via chemical vapor deposition.

22. The process of claim 17 wherein an additional step of annealing the existing structure is performed between steps "b" and "c".

23. The process of claim 17 wherein said cell dielectric comprises Lead Zirconate Titanate (PZT).

24. The process of claim 17 wherein said cell dielectric comprises doped Lead Zirconate Titanate (PZT).

25. The process of claim 17 wherein said cell dielectric is a material selected from the group consisting essentially of Barium Strontium Titanate (BST), Strontium Titanate (ST), Barium Titanate (BT) and Lead Zirconate Titanate (PZT).

26. The process of claim 17 wherein said cell dielectric comprises a combination of Barium Strontium Titanate (BST) and Lead Zirconate Titanate (PZT).

27. A process for fabricating a capacitor for a semiconductor device constructed on a silicon substrate comprising the steps of:
    a) forming a molybdenum electrode;
    b) forming a cell dielectric material superjacent said first conductive electrode; and
    c) forming a top conductive electrode superjacent said cell dielectric material;

wherein said molybdenum oxidizes to form a conductive molybdenum oxide layer between said molybdenum electrode and said cell dielectric and said molybdenum reacts with said silicon substrate to form a molybdenum silicide contact between said molybdenum electrode and said silicon substrate.

28. The process of claim 27 wherein said molybdenum silicide resistivity is less than 500 $\mu\Omega$-cm.

29. The process of claim 27 wherein said forming a molybdenum electrode comprises depositing said molybdenum via chemical vapor deposition.

30. The process of claim 27 wherein an additional step of annealing the existing structure is performed between steps "b" and "c".

31. The process of claim 27 wherein said cell dielectric comprises Lead Zirconate Titanate (PZT).

32. The process of claim 27 wherein said cell dielectric comprises doped Lead Zirconate Titanate (PZT).

33. The process of claim 27 wherein said cell dielectric is a material selected from the group consisting essentially of Barium Strontium Titanate (BST), Strontium Titanate (ST), Barium Titanate (BT) and Lead Zirconate Titanate (PZT).

34. The process of claim 27 wherein said cell dielectric comprises a combination of Barium Strontium Titanate (BST) and Lead Zirconate Titanate (PZT).

* * * * *